(12) United States Patent
Cheng et al.

(10) Patent No.: US 11,171,186 B2
(45) Date of Patent: Nov. 9, 2021

(54) LIGHT-EMITTING STRUCTURE OF DISPLAY PANEL WITH VARIABLE REFLECTIVITY UNITS HAVING PIEZOELECTRIC STRUCTURES, AND CONTROL METHOD FOR THE SAME

(71) Applicant: Shanghai Tianma AM-OLED Co., Ltd., Shanghai (CN)

(72) Inventors: Shuang Cheng, Shanghai (CN); Xiangcheng Wang, Shanghai (CN); Jinghua Niu, Shanghai (CN); Qing Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/138,452

(22) Filed: Sep. 21, 2018

(65) Prior Publication Data
US 2019/0252633 A1    Aug. 15, 2019

(30) Foreign Application Priority Data
Feb. 9, 2018    (CN) .......................... 201810133010.0

(51) Int. Cl.
*H01L 27/32* (2006.01)
*G02B 27/09* (2006.01)
(Continued)

(52) U.S. Cl.
CPC ........ *H01L 27/3241* (2013.01); *G02B 26/004* (2013.01); *G02B 27/0977* (2013.01);
(Continued)

(58) Field of Classification Search
CPC .... G02B 26/00; G02B 26/002; G02B 26/004; G02B 26/005; G02B 26/007; G02B 26/02;
(Continued)

(56) References Cited

U.S. PATENT DOCUMENTS 6,179,449 B1 *   1/2001   Chen .................... G01J 3/10
                                                    362/293
2003/0125190 A1 *   7/2003   Seo ..................... C04B 35/472
                                                    501/134

(Continued)

FOREIGN PATENT DOCUMENTS

CN            106350767 A       1/2017

*Primary Examiner* — Alexander Eisen
*Assistant Examiner* — Nelson Lam
(74) *Attorney, Agent, or Firm* — Alston & Bird LLP

(57) ABSTRACT

The present disclosure provides a light-emitting structure, a display panel, a display device, and a control method for a display panel, so as to solve the problem that the user's eyes cannot clearly see the image displayed by the display panel due to ambient light. The light-emitting structure includes a light-emitting unit and a variable reflectivity unit. The light-emitting unit includes a first electrode, a second electrode and a light-emitting layer in between. The first electrode is a transparent electrode. The variable reflectivity unit includes a piezoelectric structure and a layer of liquid reflective material between the first electrode and the piezoelectric structure. A thickness of the layer of the liquid reflective material filled between the piezoelectric structure and the first electrode is changed by deformation of the piezoelectric structure. The light-emitting structure is used to emit light for displaying the image.

17 Claims, 7 Drawing Sheets

(51) Int. Cl.
*H01L 41/187* (2006.01)
*H01L 51/52* (2006.01)
*H01L 41/09* (2006.01)
*H01L 25/16* (2006.01)
*H01L 41/04* (2006.01)
*G02B 26/00* (2006.01)
*H01L 51/00* (2006.01)

(52) U.S. Cl.
CPC ........ *H01L 25/167* (2013.01); *H01L 27/3227* (2013.01); *H01L 27/3232* (2013.01); *H01L 41/042* (2013.01); *H01L 41/0986* (2013.01); *H01L 41/187* (2013.01); *H01L 51/0031* (2013.01); *H01L 51/5234* (2013.01); *H01L 51/5246* (2013.01); *H01L 51/5271* (2013.01); *H01L 51/5275* (2013.01); *H01L 51/5281* (2013.01); *H01L 51/5284* (2013.01); *H01L 2251/5315* (2013.01); *H01L 2251/5323* (2013.01); *H01L 2251/558* (2013.01)

(58) Field of Classification Search
CPC .............. G02B 26/023; G02B 26/0833; G02B 26/0841; G02B 26/0858; H01L 25/167; H01L 41/042; H01L 41/0471; H01L 41/0472; H01L 41/08; H01L 41/0805; H01L 41/082

USPC ..................................................... 345/76–83
See application file for complete search history.

(56) References Cited

U.S. PATENT DOCUMENTS

| | | | |
|---|---|---|---|
| 2003/0231370 A1* | 12/2003 | Fujii | H01L 51/5036 359/237 |
| 2004/0179259 A1* | 9/2004 | Fujii | G02B 26/004 359/297 |
| 2004/0180133 A1* | 9/2004 | Hall | G02B 26/002 427/100 |
| 2005/0100270 A1* | 5/2005 | O'Connor | G02B 1/06 385/19 |
| 2006/0192208 A1* | 8/2006 | Kang | H01L 25/167 257/79 |
| 2008/0266635 A1* | 10/2008 | Nishioka | G02B 26/00 359/223.1 |
| 2012/0218615 A1* | 8/2012 | Yasuda | G02B 27/48 359/209.1 |
| 2014/0009937 A1* | 1/2014 | Bonora | F21V 7/16 362/235 |
| 2014/0198373 A1* | 7/2014 | Ray | G02B 26/007 359/291 |
| 2017/0123113 A1* | 5/2017 | Moreau | G02B 26/0825 |
| 2018/0188521 A1* | 7/2018 | Bolis | G02B 26/004 |
| 2018/0212183 A1* | 7/2018 | Ma | H01L 51/5212 |

* cited by examiner

LIGHT-EMITTING STRUCTURE OF DISPLAY PANEL WITH VARIABLE REFLECTIVITY UNITS HAVING PIEZOELECTRIC STRUCTURES, AND CONTROL METHOD FOR THE SAME

CROSS-REFERENCE TO RELATED APPLICATIONS

The present application claims priority to Chinese Patent Application No. CN201810133010.0, filed on Feb. 9, 2018, the content of which is incorporated herein by reference in its entirety.

TECHNICAL FIELD

The present disclosure relates to the field of display technologies, and in particular, to a light-emitting structure, a display panel, a display device, and a control method for a display panel.

BACKGROUND

Currently, organic light-emitting diode (Organic Light-Emitting Diode, OLED) display panels have been widely used because of their advantages such as self-luminescence, low power consumption, and high response speed.

An OLED display panel includes a plurality of light-emitting structures. Each light-emitting structure includes a first electrode, a light-emitting layer, and a second electrode. The first electrode is a total reflection layer including a metal material. During OLED's normal image display, an ambient light incident into the light-emitting structure is reflected by the first electrode to a user's eyes from the total reflection characteristic of the first electrode. Therefore, if the intensity of the ambient light is large, the user's eyes cannot see clearly the image displayed by the display panel.

To solve the above mentioned problem, a polarizer is usually disposed on a side of the second electrode of the light-emitting structure in related arts. However, since the polarizer only allows light with a specific polarization angle to pass, the polarizer would block some display light emitted by the light-emitting structure while preventing the ambient light from being reflected to the user's eyes. This can affect the light-emitting efficiency of the light-emitting structure.

SUMMARY

Embodiments of the present disclosure provide a light-emitting structure, a display panel, a display device, and a control method for the display panel, aiming to reduce the ambient light noise that interfere the image display on the user's eyes.

In a first aspect, the present disclosure provides a display panel, and the display panel includes a light-emitting unit, comprising a first electrode, a second electrode, and a light-emitting layer between the first and the second electrodes, wherein the first electrode is a transparent electrode; and a variable reflectivity unit, wherein the variable reflectivity unit comprises a piezoelectric structure and a layer of liquid reflective material, the layer of liquid reflective material is disposed between the piezoelectric structure and the first electrode, wherein a thickness of the layer of liquid reflective material is adjustable by deformation of the piezoelectric structure.

In a second aspect, the present disclosure provides a display device, and the display device includes the abovementioned display panel.

In a third aspect, the present disclosure provides a control method for a display panel, and the method is applicable to the abovementioned display panel. The control method for the display panel includes: controlling the deformation of the piezoelectric structure of the variable reflectivity unit of the light-emitting structure according to light intensity of ambient light, wherein the thickness of the layer of the liquid reflective material is adjusted.

BRIEF DESCRIPTION OF DRAWINGS

In order to more clearly illustrate technical solutions in embodiments of the present disclosure, the accompanying drawings used in the embodiments are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

For better illustrating the technical solutions of the present disclosure, the embodiments of the present disclosure will be described in details as follows with reference to the accompanying drawings.

It should be noted that, the described embodiments are merely exemplary embodiments of the present disclosure, which shall not be interpreted as limiting the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that, although the electrode may be described using the terms of "first", "second", etc., in the embodiments of the present disclosure, the electrode will not be limited to these terms. These terms are merely configured to distinguish electrodes from one another. For example, without departing from the scope of the embodiments of the present disclosure, a first electrode may also be referred to as a second electrode, and similarly, a second electrode may also be referred to as a first electrode.

Figure 1:
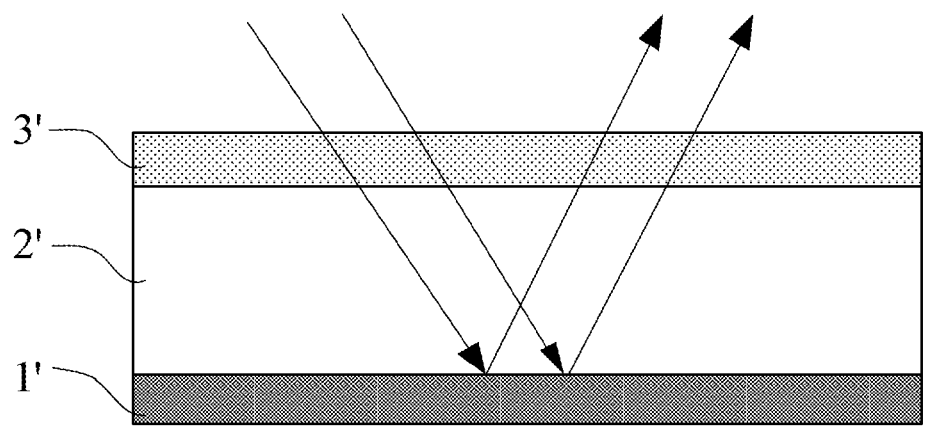
FIG. 1 is a light-emitting structure in the related art.

The OLED display panel includes a plurality of light-emitting structures. FIG. 1 is a light-emitting structure in the related arts. As shown in FIG. 1, the light-emitting structure includes a first electrode 1', a light-emitting layer 2', and a second electrode 3'. The first electrode 1' is a total reflection layer including a metal material. When the OLED display panel normally displays an image, after ambient light is incident on the light-emitting structure, the ambient light is reflected by the first electrode 1' to user's eyes due to a total reflection characteristic of the first electrode. In this way, when the intensity of the ambient light is large, the user's eyes cannot see clearly the image displayed by the display panel.

Figure 2:
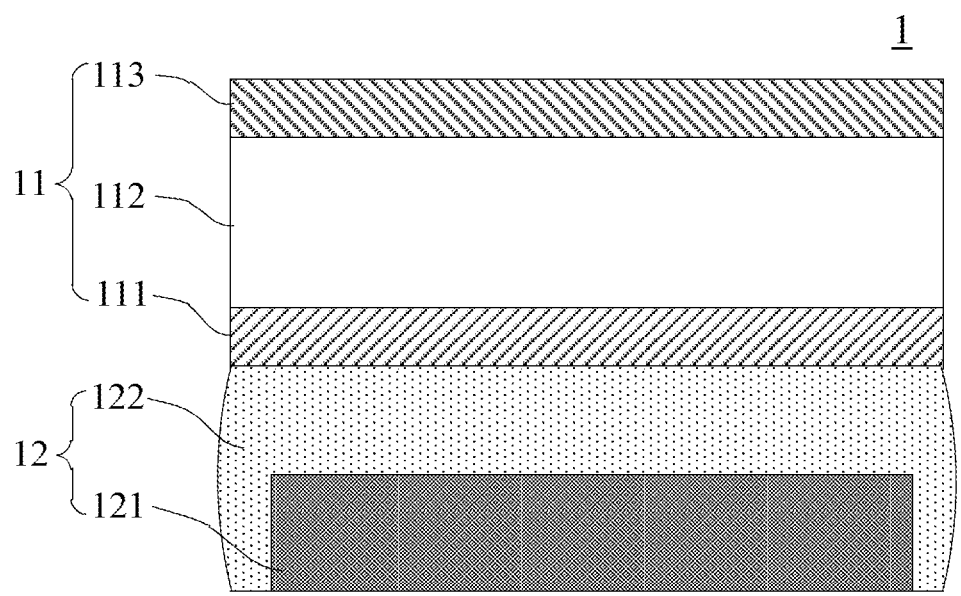
FIG. 2 is a diagram of a light-emitting structure according to an embodiment of the present disclosure.

An embodiment of the present disclosure provides a light-emitting structure 1. As shown in FIG. 2, which is a structural schematic diagram of a light-emitting structure according to an embodiment of the present disclosure, the light-emitting structure 1 includes a light-emitting unit 11 and a variable reflectivity unit 12.

Each light-emitting unit 11 includes a first electrode 111, a light-emitting layer 112, and a second electrode 113. The first electrode 111 is a transparent electrode. Each variable reflectivity unit 12 includes a piezoelectric structure 121 and a liquid reflective material 122, and a thickness of the liquid reflective material 122 filled between the piezoelectric structure 121 and the first electrode 111 can be changed by deformation of the piezoelectric structure 121.

When the piezoelectric structure 121 is stretched, a volume of the piezoelectric structure 121 increases, and space between the first electrode 111 of the light-emitting unit 11 and the piezoelectric structure 121 decreases. The stretched piezoelectric structure 121 will squeeze at least a portion of the fluid liquid reflective material 122 in between the piezoelectric structure 121 and the first electrode 111 to the periphery area of the piezoelectric structure 121 so that the thickness of the liquid reflective material 122 between the piezoelectric structure 121 and the first electrode 111 is decreased. When the piezoelectric structure 121 shrinks, the volume of the piezoelectric structure 121 decreases, and the space between the piezoelectric structure 121 and the first electrode 111 of the light-emitting unit 11 increases, so that thicker liquid reflective material 122 can fill between the piezoelectric structure 121 and the first electrode 111, thereby increasing the thickness of the liquid reflective material 122.

It should be noted that, when the piezoelectric structure 121 is stretched upward, the piezoelectric structure 121 can contact with the first electrode 111, and at this time, all of the liquid reflective material 122 is squeezed to the periphery of the piezoelectric structure 121. That is, it is possible that the liquid reflective material 122 filled between the piezoelectric structure 121 and the first electrode 111 has a thickness of zero.

When the ambient light passes through the light-emitting unit 11, since the first electrode 111 of the light-emitting unit 11 is a transparent electrode, the ambient light can be transmitted to the variable reflectivity unit 12 through the first electrode 111. Based on the working principle of the variable reflectivity unit 12, when an intensity of the ambient light is large, the liquid reflective material 122 can be squeezed out to the periphery of the piezoelectric structure 121 by a stretch of the piezoelectric structure 121. At this time, the ambient light will be absorbed by the piezoelectric structure 121 after passing through the first electrode 111 and thus cannot be reflected into the user's eyes. Therefore, with the light-emitting structure 1 provided by the embodiments of the present disclosure, when the intensity of the ambient light is large, the ambient light can be absorbed by the piezoelectric structure 121, thereby avoiding influence of the ambient light on the display image seen by user's eyes and thus improving the user's viewing experience.

In addition, the light emitted by the light-emitting layer 112 of the light-emitting unit 11 diverges in different directions. However, in the related art, since the first electrode is a total reflection electrode, the light emitted by the light-emitting layer cannot pass through the first electrode. However, in the embodiments of the present disclosure, since the first electrode 111 of the light-emitting unit 11 is a transparent electrode, light emitted by the light-emitting layer 112 in a direction toward the piezoelectric structure 121 can be emitted out through the first electrode 111. In view of this, when the intensity of the ambient light is small, the liquid reflective material 122 may be filled between the piezoelectric structure 121 and the first electrode 111 by means of the shrinkage of the piezoelectric structure 121. In this way, the light emitted by the light-emitting layer 112 in the direction toward the piezoelectric structure 121 can be reflected by the liquid reflective material 122 and then emitted out through the second electrode 113, thereby improving the light extraction efficiency of the light-emitting unit 11 and improving the display efficiency. At this time, although the ambient light is reflected into the user's eyes through the liquid reflective material 122, the display image seen by the user's eyes will not be influenced due to the small intensity of the ambient light.

It can be understood that, since the liquid reflective material 122 has fluidity, in order to define the flow range of the liquid reflective material 122 so as to change the thickness of the liquid reflective material 122 filled between the piezoelectric structure 121 and the first electrode 111, the light-emitting structure provided in an embodiment of the present disclosure further includes an elastic structure packaging the liquid reflective material 122. The liquid reflective material 122 flows in the elastic structure.

Figure 3:
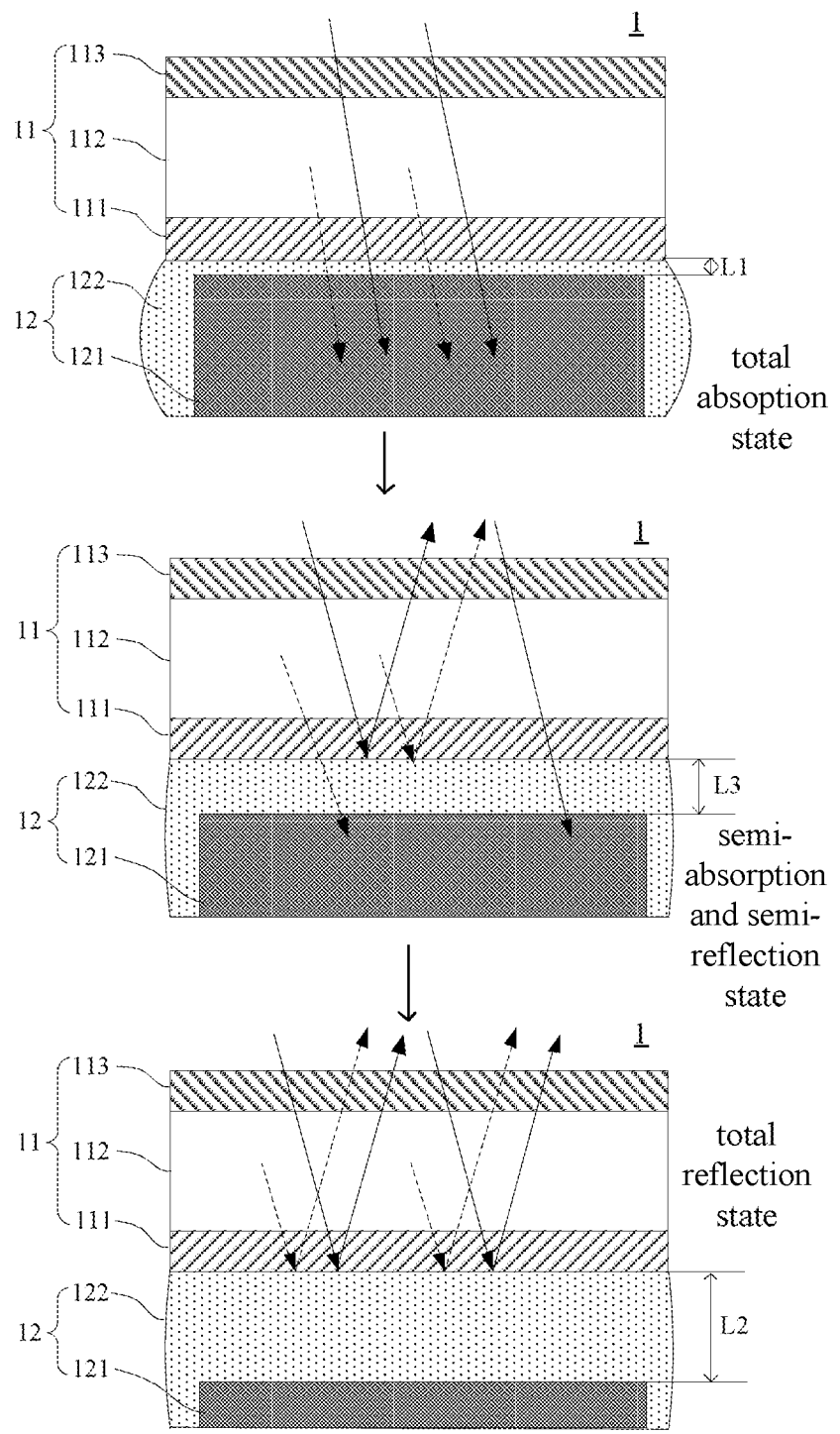
FIG. 3 shows a diagram of three different states of a variable reflectivity unit of a light-emitting structure according to an embodiment of the present disclosure.

Further, FIG. 3 shows a diagram of three different states of a variable reflectivity unit of a light-emitting structure according to an embodiment of the present disclosure. In FIG. 3, a solid line indicates ambient light, and a dashed line indicates light emitted by the light-emitting unit. When the light intensity signal of ambient light is larger than a first threshold signal, i.e., the intensity of the ambient light is large, the thickness L1 of the liquid reflective material 122 filled between the piezoelectric structure 121 and the first electrode 111 can be smaller than or equal to 10 nm through the deformation of the piezoelectric structure 121. At this time, the variable reflectivity unit 12 is in a total absorption state. When $L1 \leq 10$ nm, the thickness of the liquid reflective material 122 filled between the piezoelectric structure 121 and the first electrode 111 is very thin, and its reflectivity is small or even zero, so that the ambient light is totally absorbed by the piezoelectric structure 121 and cannot be reflected into user's eyes.

When the light intensity signal of the ambient light is smaller than a second threshold signal, i.e., the intensity of the ambient light is relatively small, the thickness L2 of the liquid reflective material 122 between the piezoelectric structure 121 and the first electrode 111 can be larger than or equal to 30 nm through the deformation of the piezoelectric structure 121. At this time, the variable reflectivity unit 12 is in a total reflection state. When L2≥30 nm, the liquid reflective material 122 filled between the piezoelectric structure 121 and the first electrode 111 is relatively thick, and its reflectivity is relatively large, so that a part of the light emitted by the light-emitting unit 11 in the direction toward the piezoelectric structure 121 is reflected by the liquid reflective material 122, thereby improving the light extraction efficiency of the light-emitting unit 11.

When the light intensity signal of the ambient light is larger than the second threshold signal and smaller than the first threshold signal, the thickness L3 of the liquid reflective material 122 filled between the piezoelectric structure 121 and the first electrode 111 can be larger than 10 nm and smaller than 30 nm through the deformation of the piezoelectric structure 121. At this time, the variable reflectivity unit 12 is in a semi-absorption and semi-reflection state. When 10 nm<L3<30 nm, the liquid reflective material 122 with this thickness has both a certain transmissivity and a certain reflectivity, and thus a portion of the ambient light can be absorbed by the piezoelectric structure 121 so as to reduce the reflection amount of the ambient light, and the light emitted by the light-emitting unit 11 can be reflected so as to increase the light extraction efficiency of the light-emitting unit 11.

It should be noted that when the thickness of the liquid reflective material 122 filled between the piezoelectric structure 121 and the first electrode 111 changes in the range of 10 nm-30 nm, the reflectivity and the transmissivity thereof are also changed accordingly. It can be understood that when the thickness of this portion of the liquid reflective material 122 is increased within this range, it has an increased reflectivity and a decreased transmissivity, and when the thickness of this portion of the liquid reflective material 122 is decreased within the range, it has a decreased reflectivity and an increased transmissivity.

Further, when the variable reflectivity unit 12 is in a total reflection state, the thickness L2 of the liquid reflective material 122 filled between the piezoelectric structure 121 and the first electrode 111 can be smaller than or equal to 200 nm. By limiting the maximum value of L2 to be 200 nm, the liquid reflective material 122 can have a relatively large reflectivity, and meanwhile the liquid reflective material 122 can be prevented from being too thick, thereby preventing the display panel from being too thick.

Figure 4:
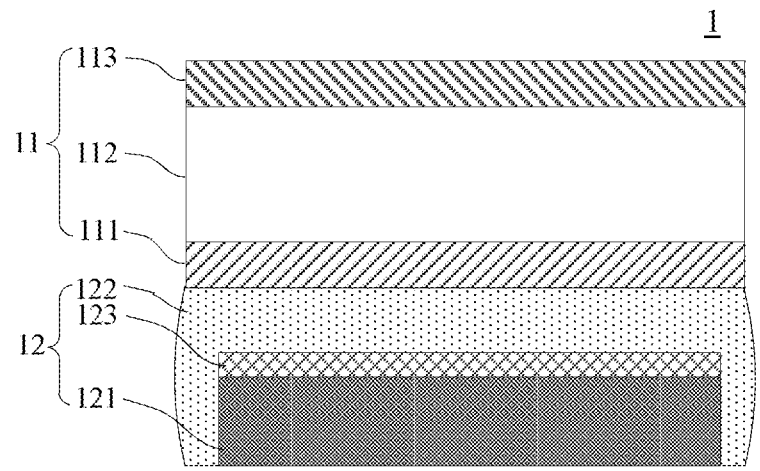
FIG. 4 is another light-emitting structure according to an embodiment of the present disclosure.

Further, FIG. 4 is another light-emitting structure according to an embodiment of the present disclosure. The variable reflectivity unit 12 further includes a light-absorbing layer 123, and the light absorbing layer 123 is disposed on the top surface of the piezoelectric structure 121.

The light-absorbing layer 123 is a film layer having a high light-absorbing capacity. By providing the light-absorbing layer 123 above the piezoelectric structure 121, it can increase the absorption of ambient light, and thus when the intensity of ambient light is large, the ambient light incident on the variable reflectivity unit 12 can be totally absorbed by the light-absorbing layer 123 and the piezoelectric structure 121.

Figure 5:
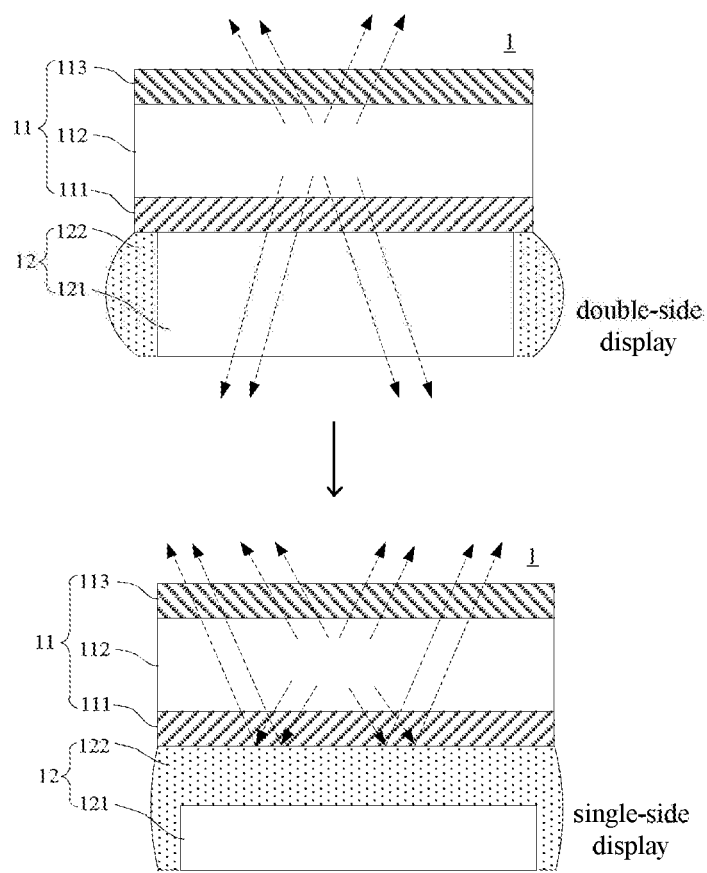
FIG. 5 shows a diagram of another two different states of a variable reflectivity unit of a light-emitting structure according to an embodiment of the present disclosure.

In addition FIG. 5 shows another light-emitting structure unit having an adjustable reflectivity according to an embodiment of the present disclosure. The piezoelectric structure 121 may be a transparent piezoelectric structure. When the piezoelectric structure 121 is a transparent piezoelectric structure, the display panel has two display modes.

Since the light emitted by the light-emitting layer 112 of the light-emitting unit 11 diverges in different directions, when the piezoelectric structure 121 is stretched and the liquid reflective material 122 is squeezed out to the periphery of the piezoelectric structure 121, the light emitted by the light-emitting layer 112 in the direction toward the piezoelectric structure 121 can be emitted through the piezoelectric structure 121. That is, the light emitted out by the light-emitting unit 11 can be emitted out through the second electrode 113 of the light-emitting unit 11 or through the piezoelectric structure 121. At this time, the display panel is in a double-side display mode.

When the piezoelectric structure 121 is shrunk, and the liquid reflective material 122 is filled between the piezoelectric structure 121 and the first electrode 111, the light emitted by the light-emitting layer 112 in the direction toward the piezoelectric structure 121 is reflected by the liquid reflective material 122. That is, the light emitted by the light-emitting unit 11 can only be emitted out through the second electrode 113 of the light-emitting unit 11. At this time, the display panel is in a single-side display mode.

It can be known that based on the specific structure of the variable reflectivity unit 12 in the embodiments of the present disclosure, when the piezoelectric structure 121 is a transparent piezoelectric structure, the display panel can be provided with two display modes, i.e., a single-side display mode and a double-side display mode, thereby improving the performance of the display panel and allowing it to better meet user's requirements.

Figure 6:
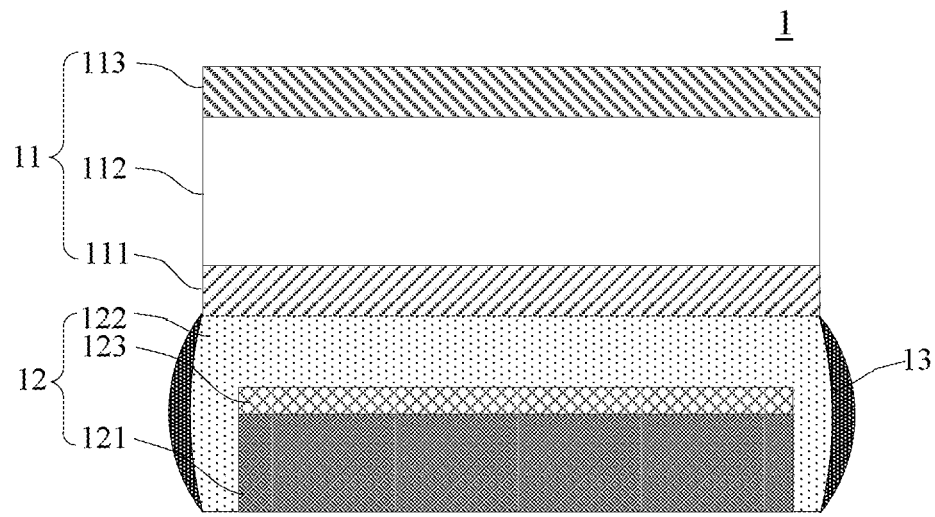
FIG. 6 is still another light-emitting structure according to an embodiment of the present disclosure.

Further, the elastic structure for packaging the liquid reflective material 122 as described above may be an elastic diaphragm, as shown in FIG. 6. FIG. 6 is still another structural schematic diagram of a light-emitting structure according to an embodiment of the present disclosure. The light-emitting structure 1 may further include an elastic diaphragm 13 in which the liquid reflective material 122 is filled. Since the liquid reflective material 122 has fluidity, the flow range of the liquid reflective material 122 can be limited by the elastic diaphragm 13 in the light-emitting structure 1 for packaging the liquid reflective material 122, and thus the thickness of the liquid reflective material 122 filled between the piezoelectric structure 121 and the first electrode can be more precisely controlled.

Optionally, the liquid reflective material 122 is a liquid metal. By using a liquid metal as the liquid reflective material 122, on the one hand, since the liquid metal has good fluidity, when the piezoelectric structure 121 is deformed, the thickness of the liquid reflective material 122 filled between the piezoelectric structure 121 and the first electrode 111 can be easily controlled. On the one hand, the liquid metal has large reflectivity due to its non-transparency, and thus it can have a strong reflection effect on ambient light and the light emitted by the light-emitting layer 112.

Optionally, the liquid metal may include liquid mercury. Based on the inherent characteristics of the liquid mercury, the liquid mercury can be in a liquid state at room temperature and therefore has better fluidity.

Optionally, the piezoelectric structure 121 is a piezoelectric ceramic. The piezoelectric ceramic can be deformed under a reverse piezoelectric effect, and the deformation of the piezoelectric ceramic can be easily controlled, so that the thickness of the liquid reflective material 122 filled between the piezoelectric ceramic and the first electrode 111 can be precisely controlled.

Optionally, the second electrode 113 of the light-emitting unit 11 is a transparent electrode. When the second electrode 113 is a transparent electrode, the light emitted through the light-emitting layer 112 can all be emitted out through the second electrode 113, thereby improving the light transmissivity of the light-emitting unit 11 and thus improving the display performance of the display panel.

Optionally, it is also possible that the second electrode 113 of the light-emitting unit 11 is a semi-transparent and semi-reflective electrode. When the second electrode 113 is a semi-transparent and semi-reflective electrode, a microcavity is formed between the first electrode 111 and the second electrode 113 of the light-emitting unit 11. When the liquid reflective material 122 is filled between the first electrode 111 and the piezoelectric structure 121, a portion of the light emitted by the light-emitting layer 112 in the direction toward the second electrode 113 may be reflected by the second electrode 113 onto the liquid reflective material 122 due to the reflection property of the second electrode 113. This portion of light is reflected for multiple times between the second electrode 113 and the liquid reflective material 122, thereby increasing the transmission wavelength of the light during the reflection process and thus achieving the optical enhancement.

Figure 7:
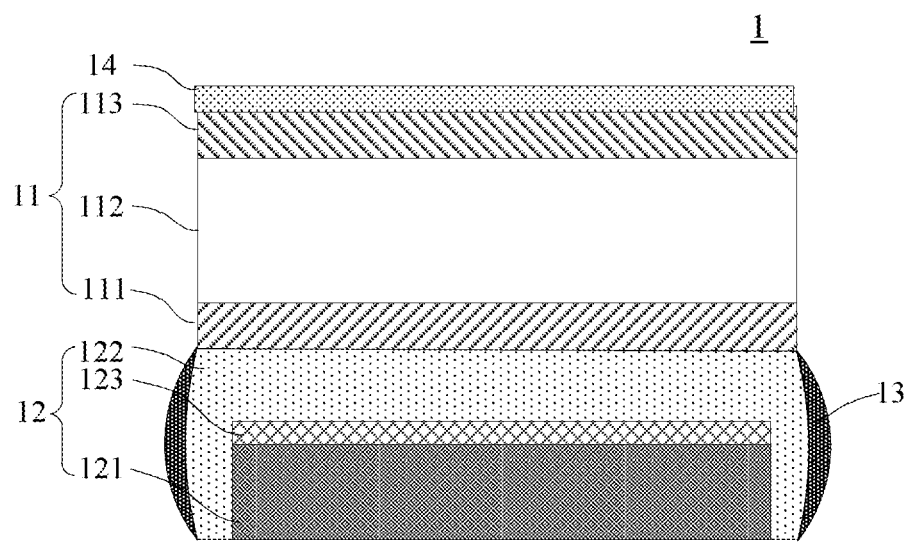
FIG. 7 is still another light-emitting structure according to an embodiment of the present disclosure.

Further, FIG. 7 is still another structural schematic diagram of a light-emitting structure according to an embodiment of the present disclosure. The light-emitting structure 1 can further include a refraction layer 14 covering the second electrode 113. The refraction layer 14 has a large refractive index and a small light-absorbing coefficient. By providing the refractive layer 14 above the second electrode 113, light extraction can be effectively improved, thereby further increasing the light extraction efficiency of the light-emitting unit 11.

Figure 8:
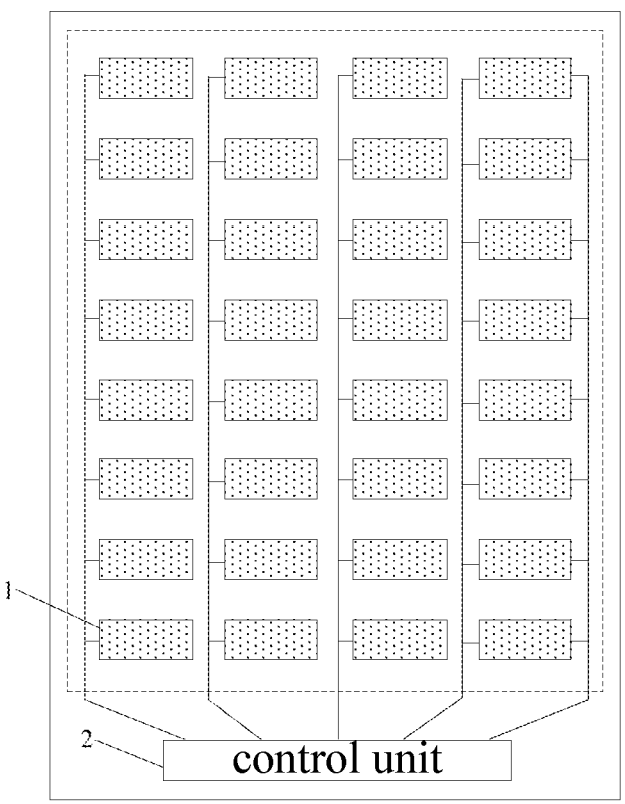
FIG. 8 is a display panel according to an embodiment of the present disclosure.
Figure 9:
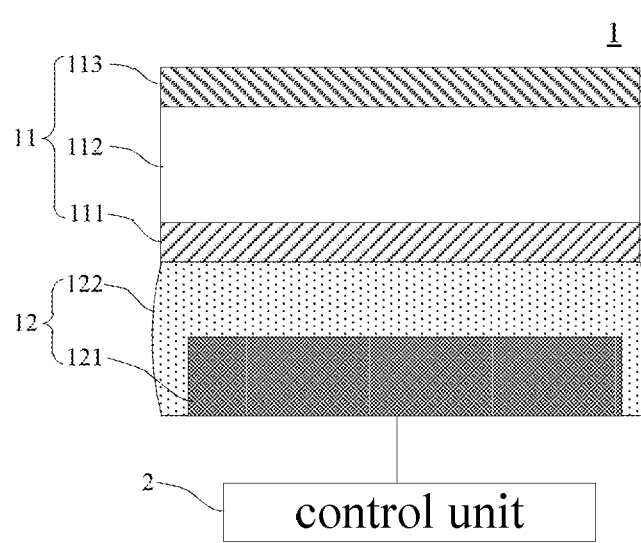
FIG. 9 shows connection relationship between a variable reflectivity unit and a control unit of a display panel according to an embodiment of the present disclosure.

An embodiment of the present disclosure further provides a display panel, as shown in FIG. 8 and FIG. 9. FIG. 8 is a structural schematic diagram of a display panel according to an embodiment of the present disclosure, and FIG. 9 shows a connection relationship between the variable reflectivity unit and a control unit of a display panel according to an embodiment of the present disclosure. The display panel includes the abovementioned light-emitting structure 1 and a control unit 2. The control unit 2 is connected to the piezoelectric structure 121 of the variable reflectivity unit 12 of the light-emitting structure 1. The control unit 2 is configured to control the deformation of the piezoelectric structure 121 according to the light intensity of the ambient light.

It can be understood that, in the display panel, the light-emitting structure 1 can be disposed in a display area of the display panel, and the control unit 2 can be disposed in a non-display area of the display panel.

With the display panel provided by the embodiments of the present disclosure, when the intensity of the ambient light is large, the control unit 2 controls the piezoelectric structure 121 of the light-emitting structure 1 to stretch in such a manner that the liquid reflective material 122 can be squeezed to the periphery of the piezoelectric structure 121. Thus, the ambient light can be absorbed by the piezoelectric structure 121 and cannot be reflected into user's eyes, thereby avoiding the influence of the ambient light on the display image seen by user's eyes.

In addition, when the intensity of the ambient light is small, the control unit 2 controls the piezoelectric structure 121 to shrink such a manner that the liquid reflective material 122 is filled between the piezoelectric structure 121 and the first electrode 111. Thus, the light emitted by the light-emitting unit 11 in the direction toward the piezoelectric structure 121 can be reflected to the second electrode 113 and can be emitted out through the second electrode 113, thereby improving the light extraction efficiency of the light-emitting unit 11 and improving the display effect.

Figure 10:
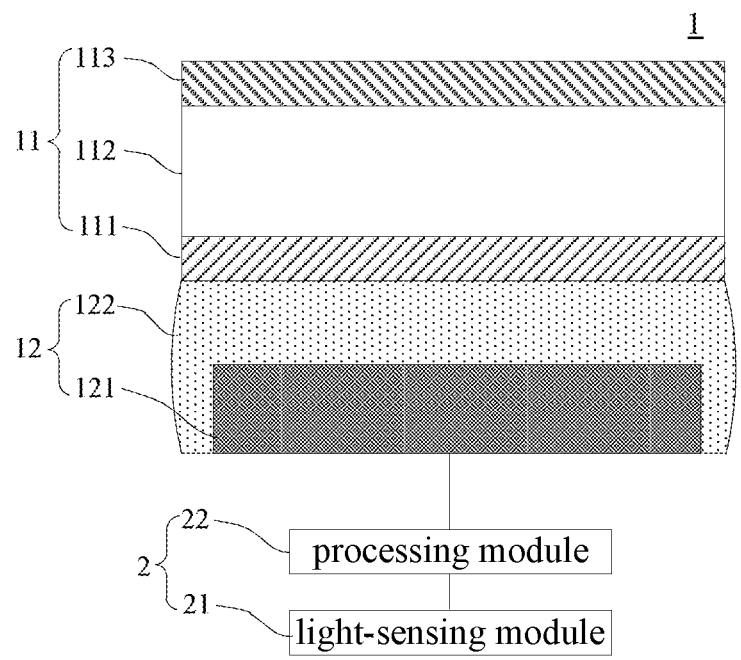
FIG. 10 is a control unit of a display panel according to an embodiment of the present disclosure.

Further, FIG. 10 shows a control unit of a display panel according to an embodiment of the present disclosure. The control unit 2 can include a light-sensing module 21 and a processing module 22.

The light-sensing module 21 is configured to sense ambient light, and generate a corresponding light intensity signal according to a light intensity of the ambient light.

The processing module 22 is connected to the light-sensing module 21. The processing module 22 is configured to compare the light intensity signal with a stored threshold signal.

In combination with FIG. 3, when the comparison shows that the light intensity signal is larger than the first threshold signal, i.e., when the intensity of the ambient light is larger, the processing module 22 is further configured to control the piezoelectric structure 121 to deform in such a manner that the thickness of the liquid reflective material 122 filled between the first electrode 111 and the piezoelectric structure 121 of the light-emitting unit 11 of the light-emitting structure 1 is smaller than or equal to 10 nm, in order to allow the liquid reflective material 122 filled between the piezoelectric structure 121 and the first electrode 111 to have a very small reflectivity or even a reflectivity of zero, which can result in that the ambient light can be all absorbed by the piezoelectric structure 121.

When the comparison shows that the light intensity signal is smaller than the second threshold signal, i.e., when the intensity of the ambient light is smaller, the processing module 22 is also configured to control the piezoelectric structure 121 deform in such a manner that the thickness of the liquid reflective material 122 filled between the first electrode 111 and the piezoelectric structure 121 is larger than or equal to 30 nm and smaller than or equal to 200 nm, in order to allow the liquid reflective material 122 filled between the piezoelectric structure 121 and the first electrode 111 to have a relatively high reflectivity, which can result in that the light emitted by the light-emitting unit 11 in the direction toward the piezoelectric structure 121 can be all reflected.

When the comparison shows that the light intensity signal is larger than the second threshold signal and smaller than the first threshold signal, the processing module 22 is further configured to control the piezoelectric structure 121 deform in such a manner that the thickness of the liquid reflective material 122 filled between the first electrode 111 and the piezoelectric structure 121 is larger than 10 nm and smaller than 30 nm, in order to allow the liquid reflective material 122 filled between the piezoelectric structure 121 and the first electrode 111 to have both a certain transmissivity and a certain reflectivity, which can result in that the reflection amount of the ambient light can be decreased and the light extraction efficiency of the light-emitting unit 11 can be increased.

Figure 11:
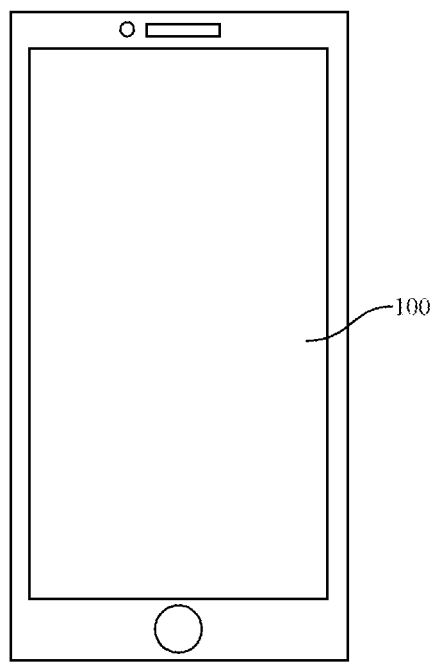
FIG. 11 is a display device according to an embodiment of the present disclosure.

An embodiment of the present disclosure further provides a display device. As shown in FIG. 11, FIG. 11 is a structural schematic diagram of a display device according to an embodiment of the present disclosure. The display device includes the abovementioned display panel 100. The structure of the display panel 100 has been described in detail in the above embodiments, and will not be repeated herein. It should be noted that, the display device shown in FIG. 11 is merely a schematic illustration, and the display device may be any electronic device having a display function such as a cellphone, a tablet computer, a notebook computer, an electronic paper book or a television.

The display device provided by an embodiment of the present disclosure includes the abovementioned display panel. With the display device, the ambient light cannot be reflected into the user's eyes when the intensity of ambient light is relatively large, thereby avoiding the influence of the ambient light on the display image seen by user's eyes.

An embodiment of the present disclosure further provides a control method for a display panel, and the control method for the display panel is applied to the abovementioned display panel.

Figures 12, 13:
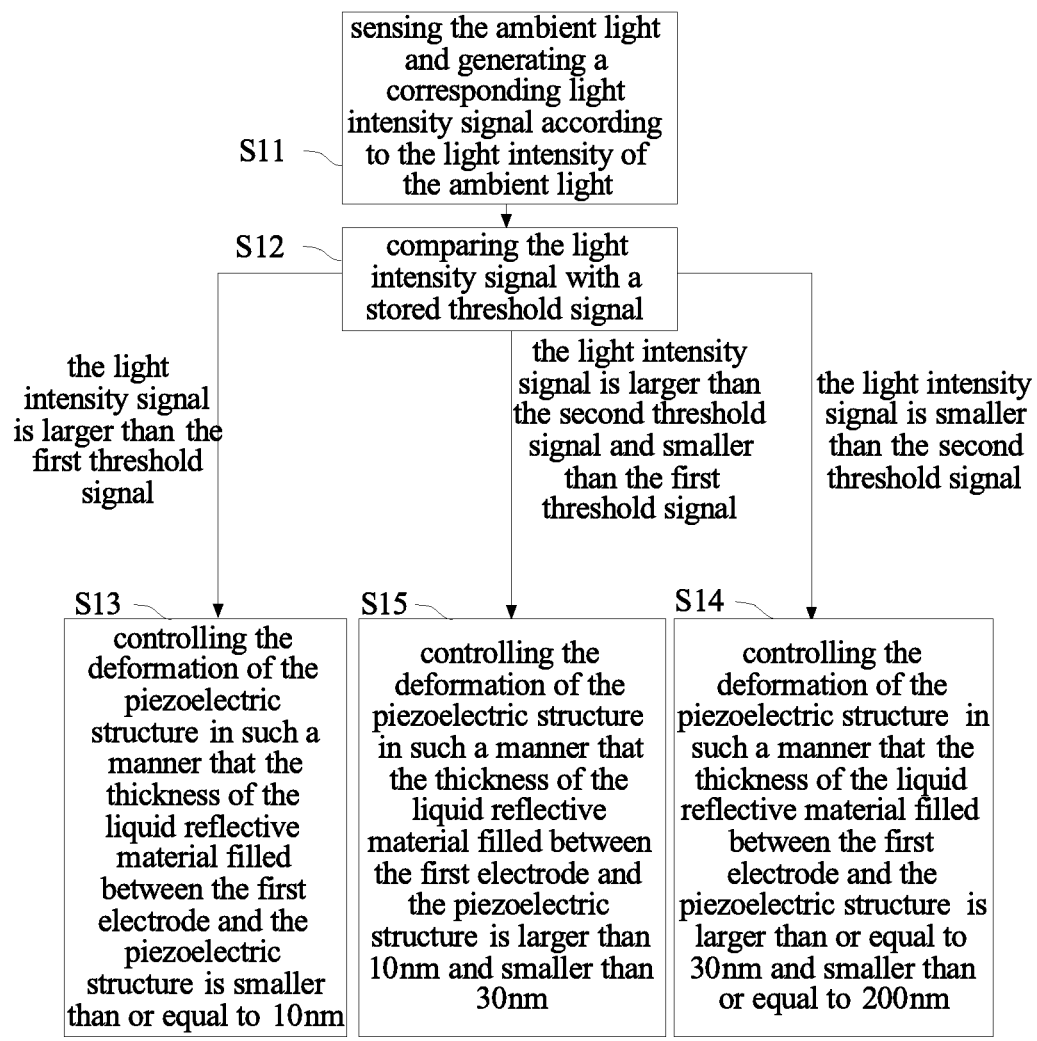
FIG. 12 describes part of control steps for a display panel according to an embodiment of the present disclosure.
FIG. 13 is a flowchart of a control method for a display panel according to an embodiment of the present disclosure.

FIG. 12 describes one of the steps S1 of a control method for a display panel in FIG. 2. In combination with FIG. 2, the control method for the display panel includes steps as follows.

At Step S1, the deformation of the piezoelectric structure 121 of the variable reflectivity unit 12 of the light-emitting structure 1 is controlled according to the light intensity of the ambient light to change the thickness of the liquid reflective material 122 filled between the first electrode 111 and the piezoelectric structure 121 of the light-emitting unit 11 of the light-emitting unit 1.

With the control method for the display panel provided by the embodiments of the present disclosure, when the intensity of the ambient light is large, the liquid reflective material 122 can be squeezed to the periphery of the piezoelectric structure 121 by controlling the stretch of the piezoelectric structure 121, so that the ambient light can be absorbed by the piezoelectric structure 121 and thus cannot be reflected into user's eyes, thereby avoiding the influence of the ambient light on the display image seen by user's eyes.

Further, in combination with FIG. 10, when the control unit 2 includes the light-sensing module 21 and the processing module 22, the control steps are illustrated in FIG. 13, which is a flowchart of a control method for a display panel according to an embodiment of the present disclosure. Step S1 includes the following steps.

At Step S11, ambient light is sensed, and a corresponding light intensity signal is generated related to the intensity of the ambient light.

At Step S12, a comparison is made between a light intensity signal and a stored threshold signal. When the light intensity signal is larger than a first threshold signal, the process proceeds to Step S13. When the light intensity signal is smaller than a second threshold signal, the process proceeds to Step S14. When the light intensity signal is larger than the second threshold signal and smaller than the first threshold signal, the process proceeds to Step S15.

At Step S13, the deformation of the piezoelectric structure 121 is controlled in such a manner that a thickness of the liquid reflective material 122 filled between the first electrode 111 and the piezoelectric structure 121 is smaller than or equal to 10 nm.

At Step S14, the deformation of the piezoelectric structure 121 is controlled in such a manner that a thickness of the liquid reflective material 122 filled between the first electrode 111 and the piezoelectric structure 121 is larger than or equal to 30 nm and smaller than or equal to 200 nm.

At Step S15, the deformation of the piezoelectric structure 121 is controlled in such a manner that a thickness of the liquid reflective material 122 filled between the first electrode 111 and the piezoelectric structure 121 is larger than 10 nm and smaller than 30 nm.

The control method for the piezoelectric structure 121 and the thickness of the liquid reflective material 122 filled between the first electrode 111 and the piezoelectric structure 121 have been described in detail in the above embodiments, and will not be repeated herein.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
   a light-emitting unit, comprising a first electrode, a second electrode, and a light-emitting layer between the first and the second electrodes, wherein the first electrode is a transparent electrode; and
   a variable reflectivity unit, wherein the variable reflectivity unit comprises a piezoelectric structure and a layer of liquid reflective material, wherein the layer of liquid reflective material is disposed between the piezoelectric structure and the first electrode, and wherein a thickness of the layer of liquid reflective material is adjustable by deformation of the piezoelectric structure,
   wherein the variable reflectivity unit further comprises a light-absorbing layer disposed between the layer of liquid reflective material and the piezoelectric structure and only arranged on a surface of the piezoelectric structure facing the first electrode; and
   wherein the piezoelectric structure comprises a first surface, a second surface and a third surface, wherein the light-absorbing layer is disposed on the first surface, the second surface and the third surface are opposite to each other and adjacent to the first surface, an entirety of the second surface is completely covered by the layer of liquid reflective material, and an entirety of the third surface is completely covered by the layer of liquid reflective material.

2. The display panel according to claim 1, wherein
   when the variable reflectivity unit is in a total-absorption state, the thickness of the layer of liquid reflective material is configured to be smaller than or equal to 10 nm;
   when the variable reflectivity unit is in a semi-absorption and semi-reflection state, the thickness of the layer of liquid reflective material is configured to be in a range from 10 nm to 30 nm; and
   when the variable reflectivity unit is in a total-reflection state, the thickness of the layer of liquid reflective material is configured to be equal to or larger than 30 nm.

3. The display panel according to claim 2, wherein the thickness of the layer of liquid reflective material is configured to be in a range from 30 nm to 200 nm when the variable reflectivity unit is in the total-reflection state.

4. The display panel according to claim 1, wherein the piezoelectric structure is a transparent piezoelectric structure.

5. The display panel according to claim 1, further comprising an elastic diaphragm wrapping the variable reflectivity unit from sides, wherein the layer of the liquid reflective material fills inside the elastic diaphragm.

6. The display panel according to claim 1, wherein the layer of the liquid reflective material is made of a liquid metal.

7. The display panel according to claim 6, wherein the liquid metal comprises liquid mercury.

8. The display panel according to claim 1, wherein the piezoelectric structure is a piezoelectric ceramic.

9. The display panel according to claim 1, wherein the second electrode is a transparent electrode.

10. The display panel according to claim 1, wherein the second electrode is a semi-transparent and semi-reflective electrode.

11. The display panel according to claim 1, wherein the display panel further comprises a refraction layer disposed on the second electrode.

12. The display panel according to claim 1, wherein the display panel further comprises a control unit,
wherein the control unit is connected to the piezoelectric structure of the variable reflectivity unit of the light-emitting structure, and is configured to control the deformation of the piezoelectric structure according to a light intensity of ambient light.

13. The display panel according to claim 12, wherein the control unit comprises:
a light-sensing module, configured to sense the ambient light and generate a corresponding light intensity signal according to the light intensity of the ambient light; and
a processing module, connected to the light-sensing module,
wherein the processing module is configured to:
compare the light intensity signal with a stored threshold signal;
when the light intensity signal is larger than a first threshold signal, control the deformation of the piezoelectric structure in such a manner that the thickness of the layer of the liquid reflective material is smaller than or equal to 10 nm and the variable reflectivity unit is in a total-absorption state;
when the light intensity signal is smaller than a second threshold signal, wherein the second threshold signal is lower than the first threshold signal, control the deformation of the piezoelectric structure in such a manner that the thickness of the layer of the liquid reflective material is in a range from 30 nm to 200 nm and the variable reflectivity unit is in a total-reflection state; and
wherein when the light intensity signal is larger than the second threshold signal and smaller than the first threshold signal, control the deformation of the piezoelectric structure in such a manner that the thickness of the layer of the liquid reflective material is in the range from 10 nm to 30 nm and the variable reflectivity unit is in a semi-absorption and semi-reflection state.

14. A display device, comprising the display panel according to claim 1.

15. A control method for a display panel, wherein the control method is applicable to the display panel according to claim 1, and wherein the control method for the display panel comprises:
controlling the deformation of the piezoelectric structure of the variable reflectivity unit of the light-emitting structure according to light intensity of ambient light, wherein the thickness of the layer of the liquid reflective material is adjusted from the deformation of the piezoelectric structure.

16. The control method for the display panel according to claim 15, wherein the control unit comprises a light-sensing module and a processing module,
wherein controlling the deformation of the piezoelectric structure according to the light intensity of ambient light, to change the thickness of the layer of the liquid reflective material comprises steps of:
sensing the ambient light and generating a corresponding light intensity signal according to the light intensity of the ambient light;
comparing the light intensity signal with a stored threshold signal;
controlling the deformation of the piezoelectric structure in such a manner that the thickness of the layer of the liquid reflective material is no larger than 10 nm when the light intensity signal is larger than a first threshold signal;
controlling the deformation of the piezoelectric structure in such a manner that the thickness of the layer of the liquid reflective material ranges from 30 to 200 nm when the light intensity signal is smaller than a second threshold signal; and
controlling the deformation of the piezoelectric structure in such a manner that the thickness of the layer of the liquid reflective material ranges from 10 nm 30 nm when the light intensity signal is larger than the second threshold signal and smaller than the first threshold signal.

17. The display panel according to claim 1, wherein the piezoelectric structure comprises a fourth surface opposite to the first surface, and the fourth surface is in direct contact with a bottom surface of the layer of liquid reflective material facing away from the first electrode.

* * * * *